(12) United States Patent
Zabler et al.

(10) Patent No.: US 6,359,450 B1
(45) Date of Patent: Mar. 19, 2002

(54) SYSTEM FOR CHECKING THE RESISTANCE OF A LOAD CONNECTED TO A TRANSFORMER

(75) Inventors: Erich Zabler, Stutensee; Anton Dukart, Wörth; Thomas Herrmann, Karlsruhe, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/029,399

(22) PCT Filed: Apr. 27, 1996

(86) PCT No.: PCT/DE96/00738

§ 371 Date: Feb. 19, 1998

§ 102(e) Date: Feb. 19, 1998

(87) PCT Pub. No.: WO97/06979

PCT Pub. Date: Feb. 27, 1997

(30) Foreign Application Priority Data

Aug. 19, 1995 (DE) .......................................... 195 30 587

(51) Int. Cl.[7] .......................... G01R 27/08; G01R 31/00
(52) U.S. Cl. ...................... 324/713; 324/502; 324/705
(58) Field of Search ................................. 324/713, 691, 324/726, 547, 705, 502; 280/731, 735, 736

(56) References Cited

U.S. PATENT DOCUMENTS

| | | | | |
|---|---|---|---|---|
| 4,160,205 A | * | 7/1979 | Hobbs et al. ................ | 324/692 |
| 4,213,083 A | * | 7/1980 | Freygang ..................... | 324/127 |
| 4,309,655 A | * | 1/1982 | Lienhard et al. ......... | 324/117 R |
| 4,810,950 A | * | 3/1989 | Young ......................... | 324/708 |
| 4,973,912 A | * | 11/1990 | Kaminski et al. ........... | 324/652 |
| 5,396,172 A | * | 3/1995 | Lat et al. ..................... | 324/547 |
| 5,481,198 A | * | 1/1996 | Patel .......................... | 324/700 |
| 5,600,255 A | * | 2/1997 | Moore et al. ................ | 324/715 |
| 5,675,242 A | * | 10/1997 | Nakano ....................... | 280/734 |
| 5,934,704 A | * | 8/1999 | Hansen et al. .............. | 280/735 |
| 5,969,432 A | * | 10/1999 | Zabler et al. .............. | 307/10.1 |
| 6,012,736 A | * | 1/2000 | Hansen et al. .............. | 340/436 |
| 6,016,104 A | * | 1/2000 | Dobler et al. ............... | 340/438 |
| 6,133,741 A | * | 10/2000 | Mattes et al. ............... | 324/502 |

FOREIGN PATENT DOCUMENTS

DE           38 12 633           10/1989

* cited by examiner

Primary Examiner—Glenn W. Brown
Assistant Examiner—Jermele M. Hollington
(74) Attorney, Agent, or Firm—Kenyon & Kenyon

(57) ABSTRACT

An arrangement that can be implemented with a simple circuit includes a measuring resistance that can either be connected in addition to a load or connected in place of the load. Furthermore, elements are provided that record the change in resistance resulting from the connection of the measuring resistance and signal when the change in resistance differs from a predefined value.

8 Claims, 1 Drawing Sheet

SYSTEM FOR CHECKING THE RESISTANCE OF A LOAD CONNECTED TO A TRANSFORMER

FIELD OF THE INVENTION

The present invention relates to an arrangement for checking the resistance of a load, preferably the squib of an air bag, connected to the secondary winding of a transformer.

BACKGROUND INFORMATION

An arrangement for checking the squib resistance on the secondary side of a rotary transformer is described in German Patent No. 38 12 633 A1. According to this related art, a rotary transformer is used, for example, for signal transmission between a controller and an air bag built into the steering wheel of a vehicle. The functionality of an air bag must be tested on an ongoing basis to ensure that it is ready to operate in an emergency situation. For this purpose, the resistance of the squib, which should typically be between 1.8 Ωand 2.5 Ω, is periodically measured. The transmission of signals using inductively coupled windings of the rotary transformer depends on the distance between the two windings, i.e., the size of the gap between the pot-type cores of the windings. Assembly and manufacturing tolerances of the steering wheel, on which the secondary-side pot-type core of the rotary transformer is installed, can distort the measured resistance value of the squib. In order to avoid such measuring signal distortions, the aforementioned related art provides an oscillating circuit on the secondary side of the rotary transformer, which is excited by a control signal from the primary side. After the control signal is switched off, the decaying response signal of the oscillating circuit is retransmitted back to the primary side and the secondary side resistance is obtained from the time constant of the decaying response signal.

In order to check the condition of a squib for a safety system (e.g. air bag) connected to the secondary side of a transformer, according to German Patent No. 38 12 631, a measuring resistance equal to the resistance of the squib can be connected to the secondary side. Both the squib and the measuring resistance can be alternately connected and disconnected, independently of each other, by switches on the secondary side of the transformer. Squib and measuring resistance are connected and disconnected by the switches. The voltage with the squib connected and the voltage with the measuring resistance connected are measured on the primary side of the transformer and the two voltages are compared. When no error is present, the two voltages should be equal because of the same resistance values of the squib and the measuring resistance. An error is signaled in the case of a deviation.

In this known measuring process, the squib is periodically disconnected from the secondary side of the transformer. Thus there are phases where in the case of an accident no pulse can reach the squib, and triggering is thus prevented.

An object of the present invention is therefore to provide an arrangement for checking the resistance of a load, preferably the squib of an air bag, connected to the secondary side of a transformer, where the function of the load is not interrupted during the checking procedure. SUMMARY OF THE INVENTION According to the presume invention, the resistance of a load, preferably the squib of an air bag, connected to the secondary side of a rotary transformer, is checked using a well-defined measuring resistance connected to the load. The change in the secondaryside total resistance due to the measuring resistance connected to it is recorded and, if the change in resistance differs from a predefined value, a signal is generated.

The measuring principle used for checking a load connected to the secondary side of a transformer requires only one measuring resistance additionally provided on the secondary side of the transformer, which may be connected to the load. Thus, the arrangement can be implemented with a very simple circuit.

DETAILED DESCRIPTION

Figure 1:
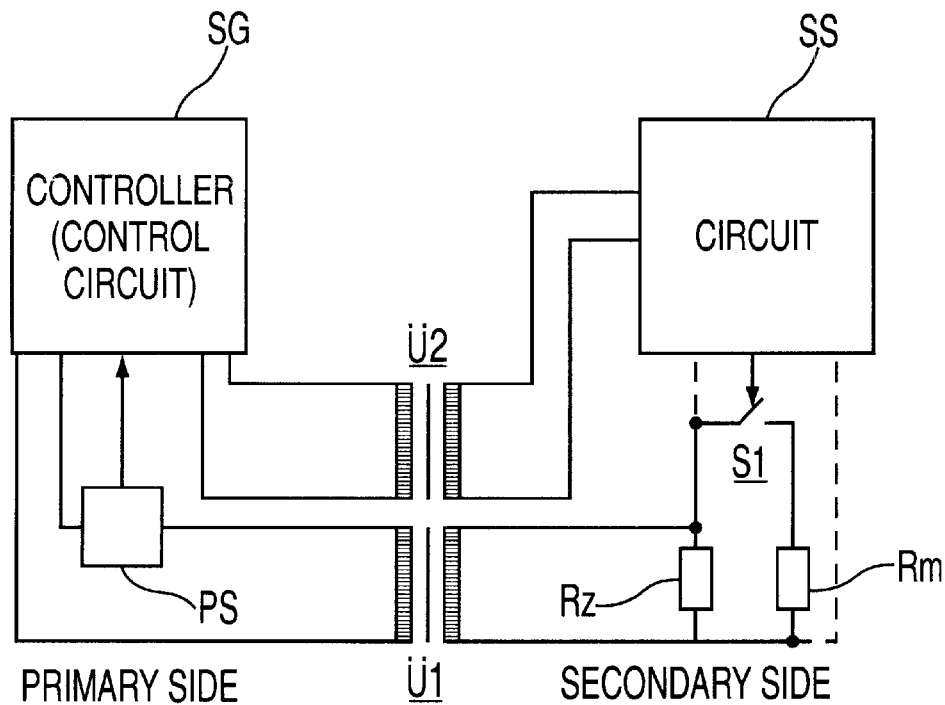
FIG. 1 shows a circuit arrangement for detecting the change in resistance of a load connected to the secondary winding of a transformer, using a well-defined measuring resistance connected in parallel.

The circuit of FIG. 1 has a first transformer Ü1, whose secondary winding is connected to a load having an ohmic resistance Rz. This transformer Ü1 may be a rotary transformer arranged between a steering wheel equipped with an air bag and a stationary steering column. The load connected on the secondary side is then the resistance Rz of an air bag squib, and the primary side of transformer Ü1 is connected to a control circuit SG connected to the vehicle chassis. This controller SG generates a triggering signal for the air bag squib if the vehicle is involved in an accident.

The squib (including the conductor from the transformer to the squib) is to be checked for reliability of operation on an ongoing basis. For this purpose, the squib resistance Rz is periodically measured and it is checked whether it remains at a predefined value. A deviation from this predefined resistance value indicates that the function of the air bag is impaired. Such a situation must be signaled in the vehicle. In order to record changes in resistance Rz of the squib with high reliability, a measuring resistance Rm is provided, which can preferably be connected in parallel to squib resistance Rz using a switch S1. This measuring resistance Rm has a predefined constant value, which is preferably approximately four to five times that of squib resistance Rz. This ensures that, if the switch is defective and can no longer be opened, only one-fourth or one-fifth of the ignition energy is lost on the secondary side of transformer Ü1 in the measuring resistance Rm connected thereto when the air bag is triggered, so that the energy induced in the squib is still sufficient for triggering the air bag. When measuring resistance Rm is connected, the total resistance connected to the secondary side of transformer Ü1, consisting of squib resistance Rz and measuring resistance Rm, changes by a well-defined value if squib resistance Rz has its known value, which ensures reliable operation of the air bag. If the change in resistance deviates from a predefined value when measuring resistance Rm is connected, a malfunction is to be signaled. Thus, the squib resistance Rz is checked by periodically connecting measuring resistance Rm and recording the resulting change in resistance. Thus distorting influences of the temperature and mechanical tolerances, which make the absolute determination of the load resistance impossible, are eliminated. A circuit SS installed on the secondary side, for example, in the steering wheel, actuates switch S1 for connecting and disconnecting measuring resistance Rm.

Circuit SS receives a switch actuation request signal from control circuit SG connected on the primary side via a second rotary transformer Ü2. The secondary side total resistance is measured when measuring resistance Rm is connected, as indicated by the dashed-line signal arrow, in the secondaryside circuit SS (e.g., using a measuring resistance bridge). The measurement result can then be transmitted back to control circuit SG via the second rotary transformer Ü2, whereupon control circuit SG signals a malfunction in the case of an inadmissible change in resistance. The ignition circuit and the diagnostic circuit are isolated from one another by the use of the two transformers.

The change in resistance caused by connecting measuring resistance Rm can also be noticed by a corresponding change in the current in the primary circuit of the transformer. A circuit PS inserted in the primary circuit of transformer Ü1 takes into account the changes in the primary current when the measuring resistance Rm is connected, and forwards them to control circuit SG. For example, control circuit SG determines, using threshold value analysis, whether the change in the primary current deviates from a predefined value. If this is the case, which is equivalent to an unallowable change in squib resistance Rz, a signal indicating malfunction is generated.

Figure 2:
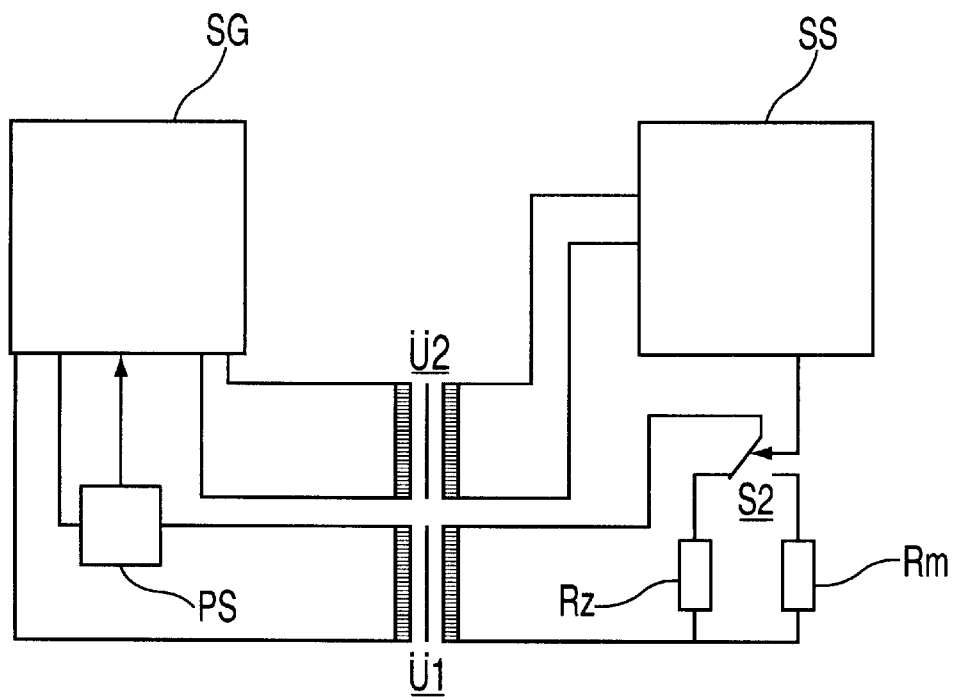
FIG. 2 shows a circuit arrangement for detecting the change in resistance of a load connected to the secondary winding of a transformer, using a well-defined measuring resistance that can alternatively be connected in series.

In the embodiment illustrated in FIG. 2, measuring resistance Rm is not connected together with squib resistance Rz, but it is connected alternatively to squib resistance Rz via a switch S2. Switch S2 is controlled as described above via circuits SS and SG. Preferably a value that is equal to resistance Rz of the squib when the squib operates properly is chosen for measuring resistance Rm. If the current is switched from squib resistance Rz to measuring resistance Rm, circuit PS will detect no change in the current in the transformer's primary circuit. However, if the primary circuit current changes, this indicates a malfunction of the squib. Control circuit SG then generates an error signal. Instead of choosing a measuring resistance equal to squib resistance Rz, a fixed difference or a fixed ratio may also exist between the two. Then the current in the primary circuit of transformer Ü1 will experience a well-defined change when it is switched from squib Rz to measuring resistance Rm. Again, it can be determined, using threshold value analysis in controller SG, whether or not this change in the primary circuit deviates from an allowable value.

Other than in air bag applications, the above-described circuits can also be used for checking other load resistances connected to the secondary winding of a transformer, for example, a horn or the operating elements of a radio or telephone arranged on the steering wheel.

What is claimed is:

1. An arrangement for checking a resistance of a load, comprising:
    a transformer having a primary side and a secondary side, wherein the secondary side is coupled to the load;
    a measuring resistance selectively coupled to the load on the secondary side of the transformer; and
    means for determining, when the measuring resistance is coupled to the load, whether a change in resistance of a combination of a resistance of the load and the measuring resistance deviates from a predetermined value and for signaling a malfunction of the load when the change in resistance deviates from the predetermined value.

2. The arrangement according to claim 1, wherein the change in resistance is determined by measuring a first resistance resulting from a combination of the load and the measuring resistance and by comparing the first resistance to a second resistance resulting from the load only.

3. The arrangement according to claim 1, wherein the load is an air bag squib.

4. The arrangement according to claim 1, wherein the measuring resistance is connected in parallel with the load.

5. The arrangement according to claim 1, wherein the measuring resistance is approximately four to five times the resistance of the load.

6. The arrangement according to claim 1, wherein the means for determining includes a resistance measuring circuit configured to measure the resistance of the combination of the resistance of the load and the measuring resistance.

7. The arrangement according to claim 1, further comprising a device for measuring a change in current on the primary side of the transformer when the measuring resistance is connected.

8. An arrangement for checking a resistance of a load, comprising:
    a transformer having a primary side and a secondary side, wherein the secondary side is coupled to the load;
    a measuring resistance selectively coupled to the load on the secondary side of the transformer;
    a first circuit configured to measure a resistance of a combination of: i) a resistance of the load and ii) the measuring resistance; and
    a second circuit configured to signal a malfunction of the load when the resistance of the combination of the resistance of the load and the measuring resistance deviates from a predetermined value.

* * * * *

UNITED STATES PATENT AND TRADEMARK OFFICE
CERTIFICATE OF CORRECTION

PATENT NO.   : 6,359,450 B1
DATED        : March 19, 2002
INVENTOR(S)  : Zabler et al.

It is certified that error appears in the above-identified patent and that said Letters Patent is hereby corrected as shown below:

Column 1,
Line 20, change "Ωand" to -- Ω and --.
Line 61, change "procedure. SUMMARY OF THE INVENTION" to -- procedure.
SUMMARY OF THE INVENTION --.
Line 63, change "presume" to -- present --.
Line 67, change "secondaryside" to -- secondary-side --.

Column 2,
Line 15, change "parallel," to -- parallel. --.
Line 65, change "eliminated. A circuit" to -- eliminated. A circuit --.

Column 3,
Line 6, change "secondaryside" to -- secondary-side --.

Signed and Sealed this

Twenty-second Day of April, 2003

JAMES E. ROGAN
*Director of the United States Patent and Trademark Office*